US009548333B2

(12) United States Patent
Lu et al.

(10) Patent No.: US 9,548,333 B2
(45) Date of Patent: Jan. 17, 2017

(54) MRAM INTEGRATION WITH LOW-K INTER-METAL DIELECTRIC FOR REDUCED PARASITIC CAPACITANCE

(71) Applicant: QUALCOMM Incorporated, San Diego, CA (US)

(72) Inventors: Yu Lu, San Diego, CA (US); Xia Li, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 160 days.

(21) Appl. No.: 14/496,525

(22) Filed: Sep. 25, 2014

(65) Prior Publication Data

US 2016/0093668 A1 Mar. 31, 2016

(51) Int. Cl.
*H01L 27/22* (2006.01)
*H01L 21/768* (2006.01)
*H01L 23/522* (2006.01)
*H01L 23/528* (2006.01)
*H01L 45/02* (2006.01)
*H01L 45/00* (2006.01)
(Continued)

(52) U.S. Cl.
CPC ....... *H01L 27/222* (2013.01); *H01L 21/76802* (2013.01); *H01L 21/76807* (2013.01); *H01L 21/76877* (2013.01); *H01L 23/528* (2013.01); *H01L 23/5226* (2013.01); *H01L 43/08* (2013.01); *H01L 43/12* (2013.01); *H01L 45/02* (2013.01); *H01L 45/08* (2013.01); *H01L 45/12* (2013.01); *H01L 2924/0002* (2013.01)

(58) Field of Classification Search
CPC ...... G11C 11/16; G11C 11/5607; H01L 43/08; H01L 27/222
See application file for complete search history.

(56) References Cited

U.S. PATENT DOCUMENTS 6,071,808 A * 6/2000 Merchant ............. H01L 21/321
257/E21.3
6,423,629 B1 7/2002 Ahn et al.
8,110,881 B2 2/2012 Kao et al.
(Continued)

OTHER PUBLICATIONS

International Search Report and Written Opinion—PCT/US2015/050453—ISA/EPO—Dec. 1, 2015.

*Primary Examiner* — Marvin Payen
*Assistant Examiner* — Victor Barzykin
(74) *Attorney, Agent, or Firm* — Muncy, Geissler, Olds & Lowe, P.C.

(57) ABSTRACT

Systems and methods of integration of resistive memory elements with logic elements in advanced nodes with improved mechanical stability and reduced parasitic capacitance include a resistive memory element and a logic element formed in a common integration layer extending between a bottom cap layer and a top cap layer. At least a first intermetal dielectric (IMD) layer of high-K value is formed in the common integration layer and surrounding at least the resistive memory element, to provide high rigidity and mechanical stability. A second IMD layer of low-K value to reduce parasitic capacitance of the logic element is formed in either the common integration layer, a top layer above the top cap layer or an intermediate layer in between the top and bottom cap layers. Air gaps may be formed in one or more IMD layers to further reduce capacitance.

12 Claims, 17 Drawing Sheets

Step S500K

(51) Int. Cl.
*H01L 43/08* (2006.01)
*H01L 43/12* (2006.01)

(56) References Cited

U.S. PATENT DOCUMENTS

| | | |
|---|---|---|
| 8,526,221 B2 | 9/2013 | Mani |
| 8,674,465 B2 | 3/2014 | Li et al. |
| 2007/0164265 A1 | 7/2007 | Kajiyama |
| 2010/0289098 A1 | 11/2010 | Li et al. |
| 2012/0032287 A1 | 2/2012 | Li et al. |
| 2013/0235656 A1 | 9/2013 | Li et al. |
| 2014/0063895 A1 | 3/2014 | Li et al. |

\* cited by examiner

Step S200E

Step S300A

Step S300B

Step S300C

Step S300D

Step S300E

Step S300F

Step S300G

Step S300H

Step S400A

Step S400B

Step S400C

Step S400D

Step S400E

Step S500A

Step S500B

Step S500C

Step S500D

Step S500E

Step S500F

Step S500J

Step S500K

US 9,548,333 B2

MRAM INTEGRATION WITH LOW-K INTER-METAL DIELECTRIC FOR REDUCED PARASITIC CAPACITANCE

FIELD OF DISCLOSURE

Disclosed embodiments are directed to integration of resistive memory such as Magnetoresistive Random Access Memory (MRAM) in advanced device nodes. More particularly, exemplary aspects relate to integration of resistive memory with improved mechanical stability and reduced parasitic capacitance.

BACKGROUND

Magnetoresistive random access memory (MRAM) is a non-volatile memory technology that uses magnetic elements. MRAM is gaining popularity as the next-generation memory technology for numerous semiconductor device applications which require low cost and high speed. Several types of MRAM are well known in the art, and MRAM operation can be briefly explained using the example of a commonly used variety of MRAM, a Spin Transfer Torque MRAM (STT-MRAM). A STT-MRAM uses electrons that become spin-polarized as the electrons pass through a thin film (spin filter).

FIG. 1 illustrates a conventional STT-MRAM bit cell 100. The STT-MRAM bit cell 100 includes magnetic tunnel junction (MTJ) storage element 105 (also referred to as "MTJ stack" or simply, "MTJ"), transistor 101, bit line 102 and word line 103. MTJ 105 is formed, for example, from pinned layer 124 and free layer 120, each of which can hold a magnetic moment or polarization, separated by insulating tunneling barrier layer 122. There may be an anti-ferromagnetic (AFM) layer and a cap layer (not shown) in MTJ 105. The AFM layer is used to pin the magnetic moment of the pinned layer. The cap layer is used as a buffer layer between the MTJ and metal interconnects. The polarization of the free layer can be reversed by applying current in a specific direction such that the polarity of the pinned layer and the free layer are either substantially aligned or opposite. The resistance of the electrical path through the MTJ varies depending on the alignment of the polarizations of the pinned and free layers. This variation in resistance can be used to program and read STT-MRAM bit cell 100, as is known. STT-MRAM bit cell 100 also includes circuit elements, source line 104, sense amplifier 108, read/write circuitry 106 and bit line reference 107. Those skilled in the art will appreciate the operation and construction of STT-MRAM bit cell 100 as known in the art.

As seen from the above example, the fabrication of a conventional STT-MRAM bit cell involves integration of the various above-described components on a circuit board or semiconductor package. More specifically, memory or storage elements (e.g., MTJ 105) may be integrated with various other circuit elements (generally referred to herein, as, "logic elements") such as, passive components, metal wires, vias, transistors, logic gates, etc. In general, such integration requires process compatibility between the memory elements and the logic elements. Several challenges arise in this area, particularly as device technology continues to advance towards smaller and smaller device sizes.

For example, during the fabrication of MRAM devices such as STT-MRAM bit cell 100, it is important to ensure that capacitance (C) of various components and resistance (R) of various components and connections are maintained at low values. This is important for reducing cross coupling and RC delay values.

However, dielectric material, conventionally referred to as interlayer dielectric (ILD) material or inter-metal dielectric (IMD) material, used for integrating dense metal levels or metal layers required at advanced device nodes, may require using low-K or extreme low-K (ELK) dielectric materials with a view to lowering parasitic capacitance. Lowering the dielectric constant is conventionally accomplished by inserting light weight elements to reduce the silicon-oxide bond density, which is in turn conventionally associated with degraded mechanical stability.

Several additional Chemical mechanical polishing (CMP) process steps are used in conventional manufacture of MRAM devices. These additional CMP steps before the fabrication of Cu interconnect structures require a high level of mechanical stability, which may not be compatible with the use of low-K or ELK dielectric materials. The conventional approaches do not effectively balance the conflicting effects of the K-value of dielectric materials on parasitic capacitance and mechanical stability. Further, such low-K dielectric materials may require high-temperatures (e.g., 400 C.) for ultraviolet (UV) curing, which may cause degradation of the MRAM devices such as MTJ 100.

Moreover, integrating MRAM devices in advanced logic nodes (e.g., 28 nm and below) with logic processes such as complementary metal oxide semiconductor (CMOS) back end of line (BEOL) processes, introduces additional challenges. Vias are conventionally used for connecting elements between different layers of interconnections. The separation between adjacent layers, which relates to a vertical height of the vias may be different from that of the MRAM elements such as MTJ 100. The maximum via height may be limited by aspect ratio specifications whereas the minimum MTJ height may be limited by CMP tolerances. Thus, there may be mismatches between the via heights and MTJ heights which may frustrate integration of these elements on a common device.

Accordingly, there is a need in the art for avoiding the aforementioned conventional approaches for integration of MRAM devices.

SUMMARY

Exemplary embodiments are directed to systems and methods of integration of resistive memory such as Magnetoresistive Random Access Memory (MRAM) in advanced device nodes. More particularly, exemplary aspects relate to integration of resistive memory with improved mechanical stability and reduced parasitic capacitance. As such, in some examples, exemplary resistive memory elements are integrated with logic elements, with IMD high-K layers configured to provide high rigidity and mechanical stability to the resistive memory elements and low-K IMD layers to provide low parasitic capacitance to logic elements.

For example, an exemplary aspect is directed to method of forming a semiconductor device, the method comprising: forming a resistive memory element in a common integration layer extending between a bottom cap layer and a top cap layer, forming a logic element in the common integration layer, the logic element extending between the bottom cap layer and the top cap layer, forming at least a first intermetal dielectric (IMD) layer in the common integration layer, the first IMD layer of high-K value and surrounding at least the resistive memory element, and forming at least a second IMD layer of low-K value to reduce capacitance of the logic element.

Another exemplary aspect is directed to a method of forming a semiconductor device, the method comprising: forming first and second vias for a logic element and a resistive memory element in an intermediate intermetal dielectric (IMD) layer of low-K value, forming the logic element and the resistive memory element in a common integration layer comprising a first IMD layer of high-K value, wherein the common integration layer is formed above the intermediate IMD layer, and wherein a combination of the intermediate IMD layer and the common integration layer extend between a bottom cap layer and a top cap layer, and forming air gaps in the combination of the intermediate IMD layer and the common integration layer.

Yet another exemplary aspect is directed to a semiconductor device comprising, a resistive memory element formed in a common integration layer extending between a bottom cap layer and a top cap layer, a logic element in the common integration layer, the logic element extending between the bottom cap layer and the top cap layer, at least a first intermetal dielectric (IMD) layer formed in the common integration layer, the first IMD layer of high-K value and surrounding at least the resistive memory element, and at least a second IMD layer of low-K value to reduce capacitance of the logic element.

Another exemplary aspect is directed to a semiconductor device comprising: first and second vias for a logic element and a resistive memory element formed in an intermediate intermetal dielectric (IMD) layer of low-K value, wherein the logic element and the resistive memory element are formed in a common integration layer comprising a first IMD layer of high-K value, wherein the common integration layer is formed above the intermediate IMD layer, and wherein a combination of the intermediate IMD layer and the common integration layer extend between a bottom cap layer and a top cap layer, and air gaps formed in the combination of the intermediate IMD layer and the common integration layer.

BRIEF DESCRIPTION OF THE DRAWINGS

The accompanying drawings are presented to aid in the description of embodiments of the various embodiments and are provided solely for illustration of the embodiments and not limitation thereof.

DETAILED DESCRIPTION

Figure 1:
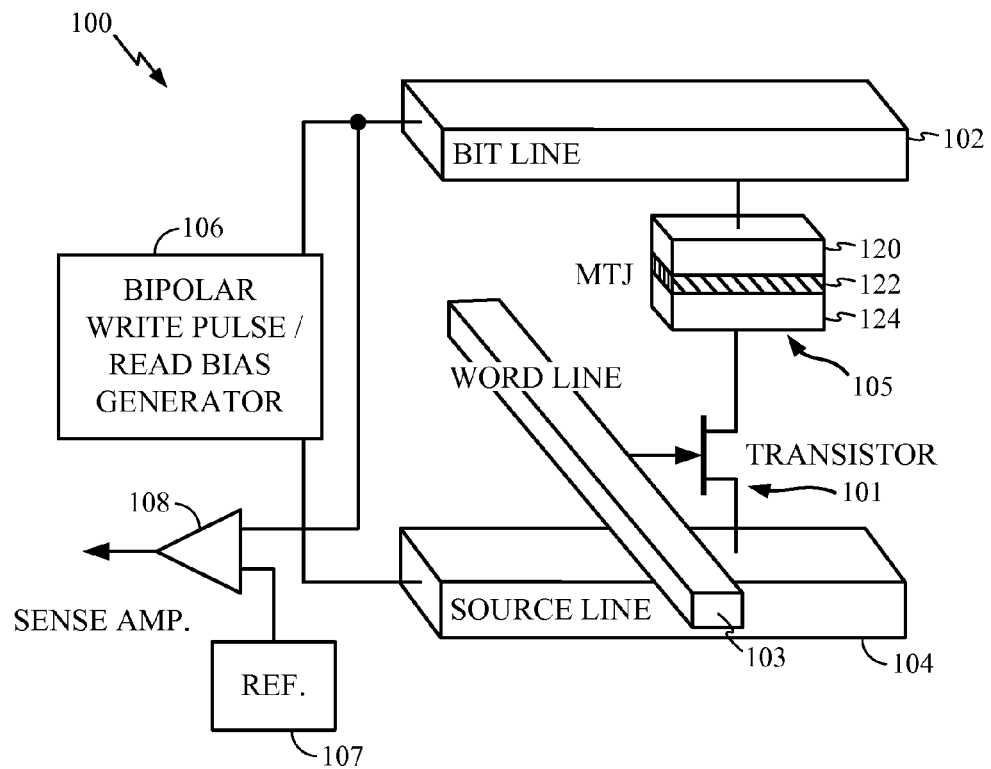
FIG. 1 is an illustration of a conventional MRAM circuit with an MTJ storage element.

Aspects of the various embodiments are disclosed in the following description and related drawings directed to specific embodiments. Alternate embodiments may be devised without departing from the scope of the invention. Additionally, well-known elements of the various embodiments will not be described in detail or will be omitted so as not to obscure the relevant details of the various embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Moreover, unless expressly specified to the contrary, "one or more" is to be construed synonymously with "at least one."

In this description, terms such as "top" and "above" and similarly, "bottom" and "below" are used to convey relative position and/or relative direction of the numerous components of exemplary aspects, merely for ease of explanation and description of exemplary features. As such, these terms are not meant to be absolute requirements or limitations. For example, these terms may be replaced by more general terms such as a "first side"/"first direction" and a "second side"/ "second direction," respectively, without departing from the scope of the explanations.

In general, interconnections and contacts to memory elements may be formed using a conventional process of metallization, which refers to the process by which a metal layer is deposited, following which, the metal layer is etched and patterned. Dielectric material, such as ILD or IMD is then filled. In contrast, a damascene process may be used, which can take the form of a single-damascene or a double-damascene process. In a single-damascene process dielectric material such as ILD/IMD is first deposited in a layer, following which patterns are created and then metal is filled for forming contacts or interconnections. In a double damascene process, once the dielectric is deposited, trenches and/or vias are created in a first step and metal connections are formed in a second step.

In exemplary aspects, a single-damascene process may be used for forming interconnections with resistive memory such as MRAM/MTJs, as opposed to the dual-damascene processes. Exemplary aspects are directed to integration of MRAM devices with logic elements using single-damascene processes which avoid aforementioned drawbacks of increased capacitance reduced mechanical stability, via and MTJ height mismatches, etc., that are seen in conventional integration efforts discussed previously.

More particularly, in exemplary aspects, a single damascene process may be used in the formation of a via as part of logic integration in a common layer with integration of a resistive memory device. Separate dielectric layers may be used for surrounding the resistive memory device and the logic devices in exemplary aspects. Thus, mechanical stability is not compromised and capacitance can be maintained low by appropriate use of different dielectric materials, as well as, in some cases, one or more air gaps. Further, it will be understood that while the description herein is focused on MRAM or MTJ as examples of resistive memory devices, it will be understood that exemplary aspects may be extended to integration of any resistive memory device with logic elements, without departing from the scope of this disclosure.

Accordingly, exemplary aspects relate integration of resistive memory devices with logic elements, which are compatible with future device technologies with extremely small and ever shrinking dimensions (e.g., 20 nm, 16 nm, 10 nm, and so on . . . ). However, it will be understood that exemplary embodiments are not to be construed as limited to any particular device technology, current, or future, but on the other hand, the embodiments represent efficient solutions for improved utilization of space and area in integrated circuits or semiconductor devices comprising MRAM integration. As such, the described embodiments may pertain to device technologies where the maximum height available in a layer of MRAM integration is only sufficient to accommodate the height of an MTJ element. Thus, the height of logic elements such as a via in a common MRAM integration layer comprising an MRAM element will be at most equal the height of the MTJ element in these aspects.

A first embodiment will now be described with reference now to FIGS. 2A-E, which illustrate cross-sectional views for exemplary process steps S200A-E respectively, along with related components, for formation of an exemplary semiconductor device 200 which includes MRAM and logic elements. In this first embodiment, a single-damascene via level is integrated with an MTJ in a common layer with a high-K dielectric (e.g. SiO2, non-porous organosilicate glass (OSG), etc.) to achieve high rigidity and mechanical stability, in combination with a single-damascene wire or interconnect level in lower-K dielectric formed in a layer above the common layer. The high-K dielectric provides higher rigidity and mechanical stability in comparison with the lower-K dielectric.

Figure 2A:
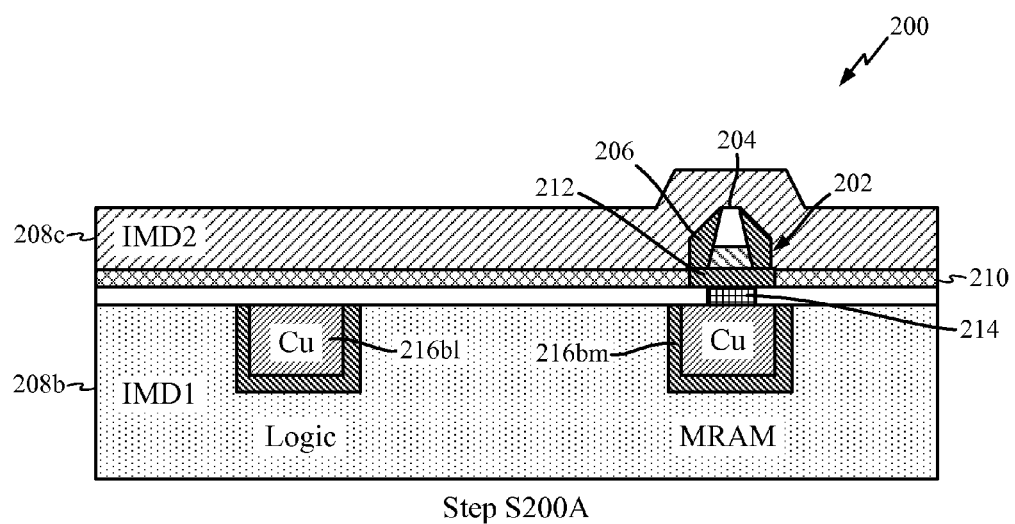
FIGS. 2A-E illustrate cross-sectional views for an exemplary process steps S200A-E respectively, and related components, for formation of a first exemplary semiconductor device 200.

Accordingly, with reference to FIG. 2A, Step 200A an initial view of semiconductor device 200 comprising MRAM and logic integration, is illustrated. In general, components of semiconductor device 200 are separately shown under a "logic" side on the left hand side and "MRAM" side on the right hand side. The logic side pertains to circuit elements and components, representatively formed by vias and/or metal lines, in addition to semiconductor devices not shown in the figure, and may be collectively referred to as "logic elements." On the other hand, the MRAM side includes MTJ 202 and related components for formation of contacts to the MTJ, and may be collectively referred to as "MRAM elements." Exemplary aspects include integration of MRAM elements compatible with formation of logic elements.

In more detail, MTJ 202 can include hard mask (HM) 204 and protective side cap 206 in common IMD layer 208c, although it will be understood that HM 204 and side cap 206 are optional features that need not be present in some exemplary embodiments. One or more cap layers 210 separate common IMD layer 208c from bottom IMD layer 208b. Bottom IMD layer 308b comprises bottom metal lines 216bl on the logic side and 216bm on the MRAM side. The bottom metal lines 216bl and 216bm are exemplarily made of copper (Cu). MTJ 202 is coupled to bottom electrode (BE) 212, shown to be formed within one of cap layers 210, and coupled to bottom metal line 216bm through BE contact 214 formed within another one of cap layers 210.

Briefly, step S200A involves forming the bottom IMD layer 208b (or IMD1), etching and metalizing to form bottom metal lines 216bl and 216bm, depositing one or more cap layers 210, etching the one or more cap layers for formation of BE contact 214 and BE 212, and depositing layers (e.g., pinned layer, barrier layer, and free layer) of MTJ 202, and forming HM 204. MTJ 202 is then patterned, and following passivation and oxidation, side cap 206 is added. Common IMD layer 208c (or IMD2) is then deposited, where common IMD layer 208c is of a high K and required rigidity for providing MTJ 202 with high mechanical stability. It will be noted that logic elements such as interconnects, wires, vias, etc., may require a lower K dielectric in order to minimize parasitic capacitance, but such a low K dielectric may not affect stability of the vias. Keeping this in mind, the following steps will now be explained.

Figure 2B:
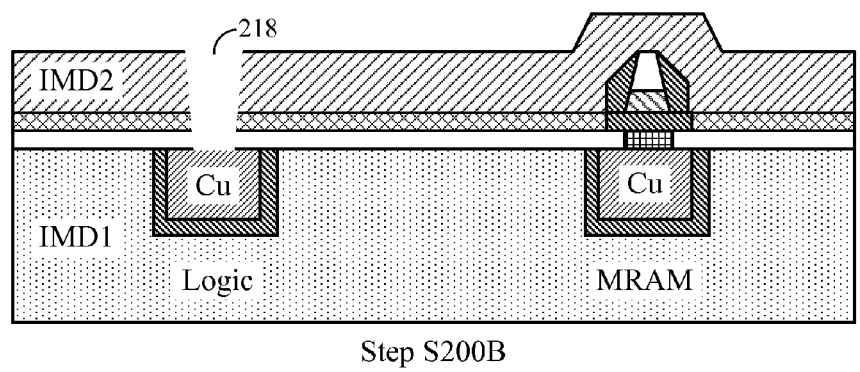
Figure 2C:
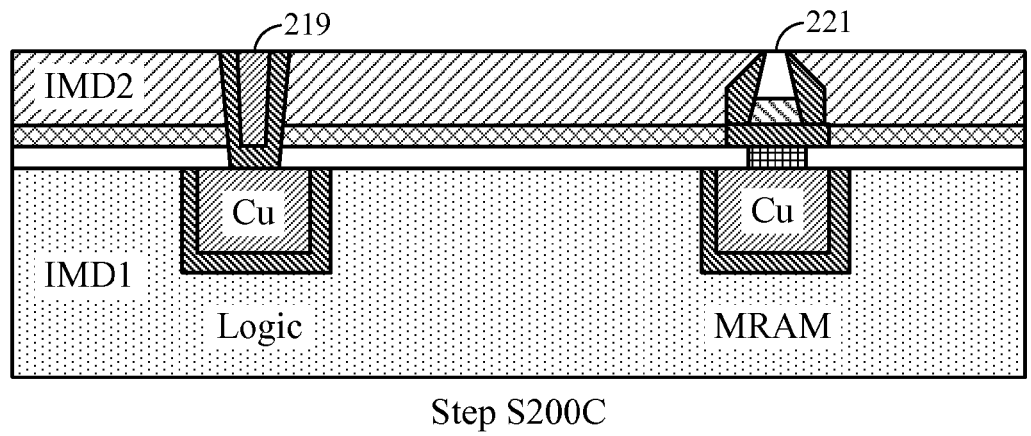

Moving to FIG. 2B, step S200B is illustrated where hole 218 for a via is patterned and etched. In FIG. 2C, step S200C, a barrier metal or copper filling is performed in hole 218 to form via 219. Additionally, in this step, a process of planarization or chemical mechanical polishing (CMP) is used to expose the top surface 221 of MTJ 202, or rather, the top surface 221 of HM 204.

Figure 2D:
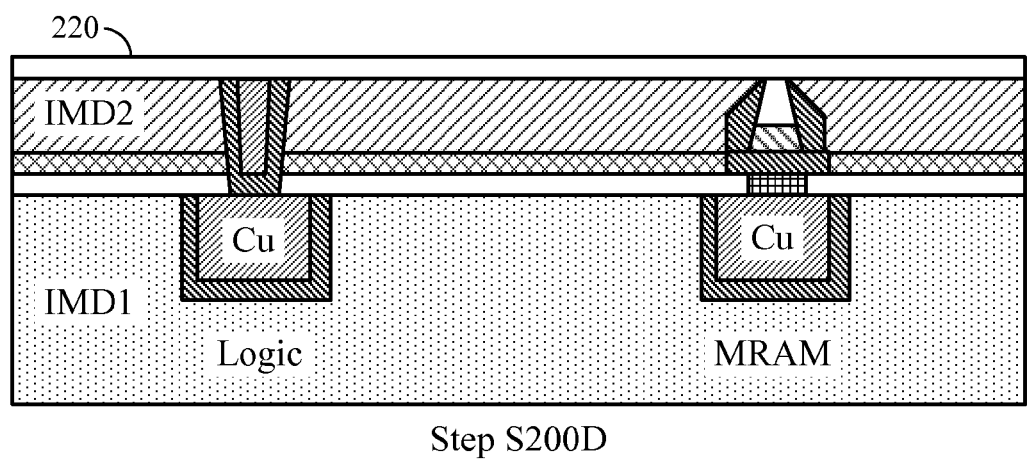
Figure 2E:
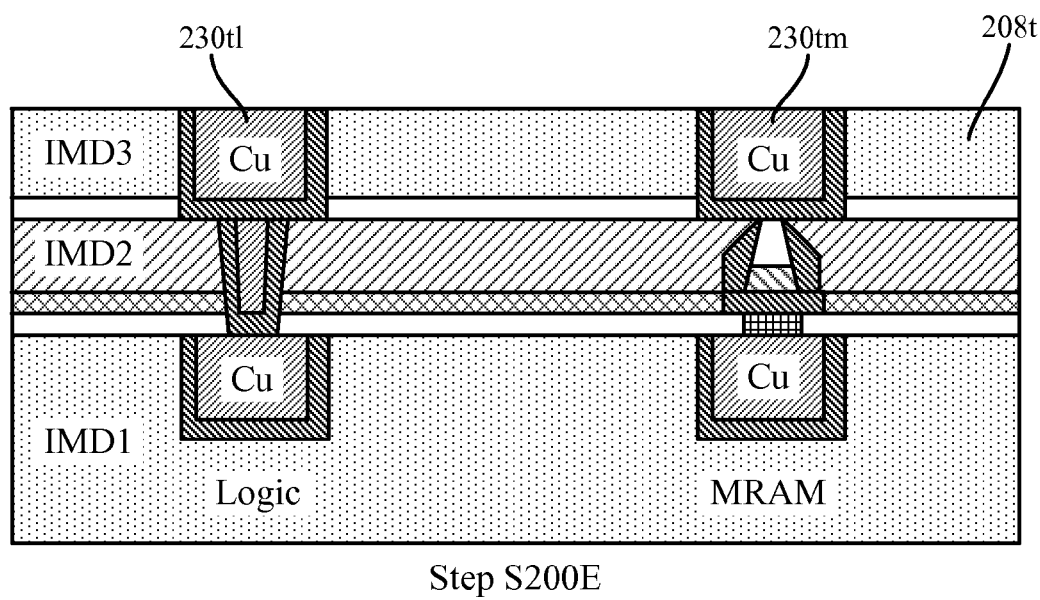

In FIG. 2D, step S200D, dielectric capping layer 220 is deposited as an etch stop layer (ESL) over common IMD layer 208c. Dielectric capping layer 220 may comprise Carbon (C) doped Silicon Nitride or Silicon Oxide or other dielectric material, such that dielectric capping layer 220 can act as an etch stop layer without significantly increasing the total effective dielectric constant of the final structure of semiconductor device 200. Following this, FIG. 2E, step S200E, includes filling top IMD layer 208t over cap layer 220. Top IMD layer 208t (or IMD3) is formed from a low-K dielectric material. In top IMD layer 208t, top metal line 230tl (or "top metal line contact") on the logic side, and top metal line 230tm on the MRAM side, are formed. Top metal line 230tl contacts with via 219 and top metal line 230tm contacts HM 204. This manner of forming the interconnections is a single damascene process. Since these interconnects comprising top metal lines 230tl and 230tm are formed in low-K top IMD layer 208t, parasitic capacitance is low. In this manner, both low capacitance in the low-K top IMD layer 208t and high mechanical stability in the high-K common IMD layer 208c are achieved in the first embodiment, which avoids the aforementioned drawbacks of conventional MRAM integration.

A second embodiment will now be described with reference now to FIGS. 3A-H, which illustrate cross-sectional views for exemplary process steps S300A-H respectively, along with related components, for formation of an exemplary semiconductor device 300 comprising MRAM and logic elements. Rather than divide the high-K and low-K dielectrics into separate layers like in the first embodiment, the second embodiment includes aspects related to two or more dielectric fillings in the same layer, with a high-K dielectric material filling for the MRAM side and a low-K dielectric material filling for the logic side. Thus, in this embodiment, once again, a single damascene via formation is used to form a via in a common layer with an MTJ, the common layer having a high-K dielectric surrounding the MTJ. This high-K dielectric is removed outside of the MTJ or the MRAM side after a CMP process, and replaced with low-K dielectric material in the logic side.

Figure 3A:
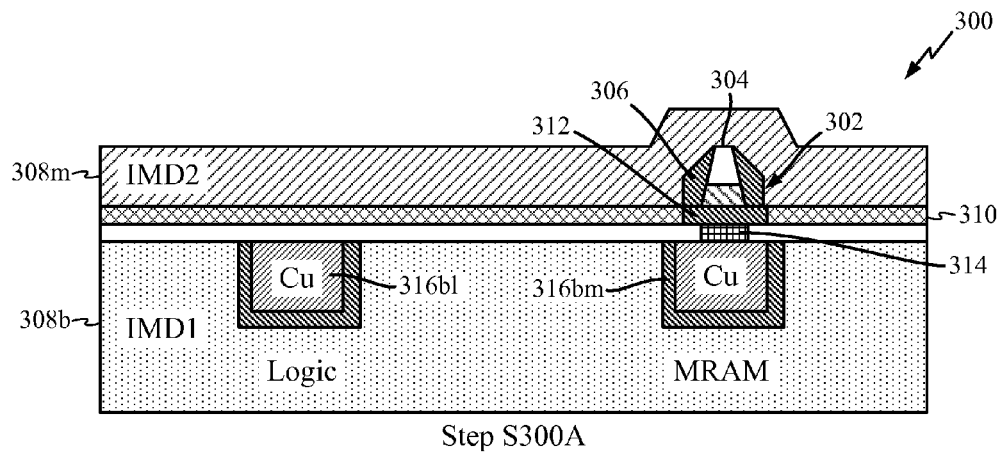
FIGS. 3A-H illustrate cross-sectional views for an exemplary process steps S300A-H respectively, and related components, for formation of a second exemplary semiconductor device 300.

In more detail, FIG. 3A shows step S300A, which is similar to step S200A of FIG. 2A. Step S300A includes forming bottom IMD layer 308b (or IMD1), etching and metalizing to form bottom metal lines 316bl and 316bm, depositing one or more cap layers 310, etching the one or more cap layers for formation of BE contact 314 and BE 312, depositing layers (e.g., pinned layer, barrier layer, and free layer) of MTJ 302, and forming HM 204. MTJ 302 is then patterned, and following passivation and oxidation, side cap 306 is added. MRAM IMD layer 308m (or IMD2) is then deposited, where MRAM IMD layer 308m is of a high-K and high rigidity, which provides MTJ 302 with a higher mechanical stability.

Figure 3B:
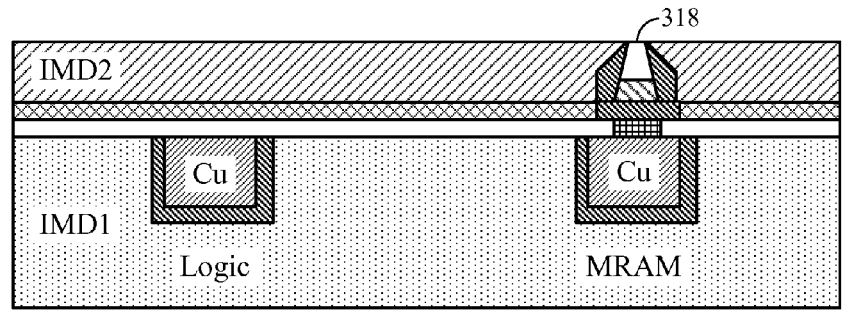

Moving to FIG. 3B, step S300B is illustrated where chemical mechanical polishing (CMP) is used to expose the top surface of MTJ 302, or rather, the top surface of HM 304.

Figure 3C:
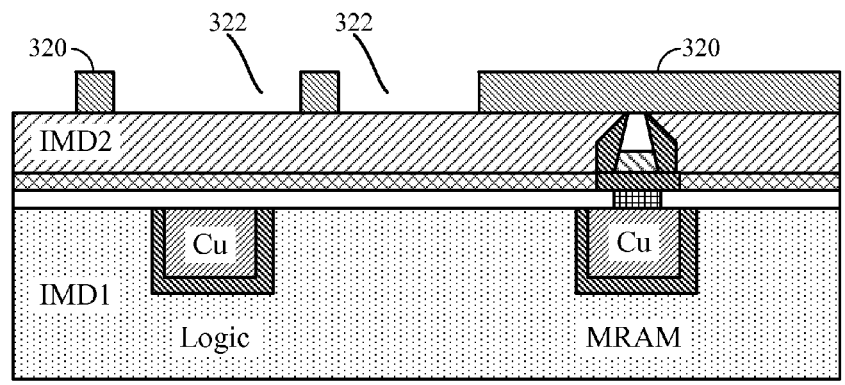

In FIG. 3C, step S300C, lithography is performed using masks 320 in order to protect MRAM IMD layer 308m, and also to create some dummy areas with IMD2 material in the logic side. Patterns or areas 322 are exposed during lithography in this step.

Figure 3D:
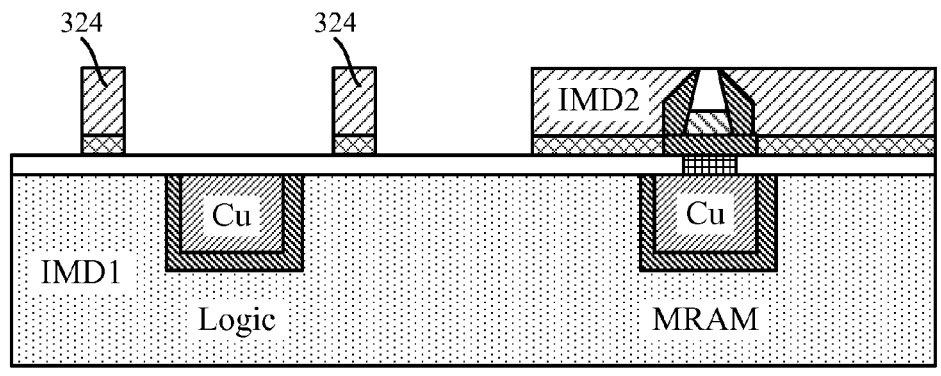

In FIG. 3D, step S300D, the IMD2 material is selectively removed from areas outside the MRAM side comprising MTJ 302, while retaining MRAM IMD layer 308m in the MRAM side and dummy IMD2 elements 324 in the logic side.

Figure 3E:
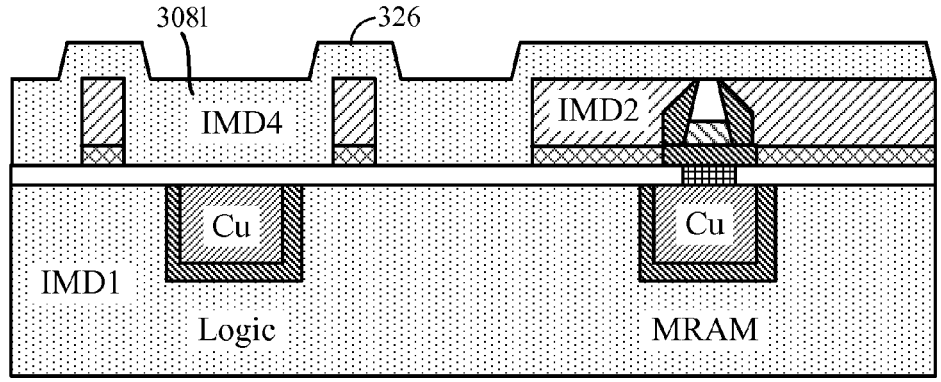
Figure 3F:
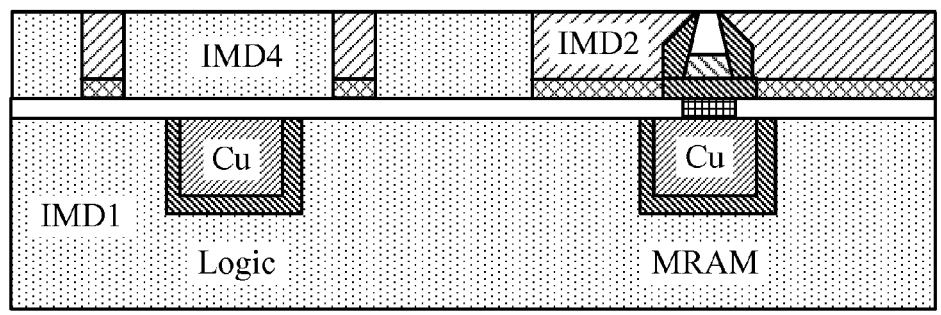

In FIG. 3E, step S300E, a low-K dielectric material (IMD4) is deposited on the wafer, referred to as logic IMD layer 308l. In FIG. 3F, step S300F, logic IMD layer 308l is planarized down to the height of the dummy IMD2 elements 324 and that of MTJ 302. CMP is performed or a spin-on-material etch back process may be used instead in this step to remove excess IMD4 material from the tops of dummy IMD2 elements 324, as shown in FIG. 3F, step S300F.

Figure 3G:
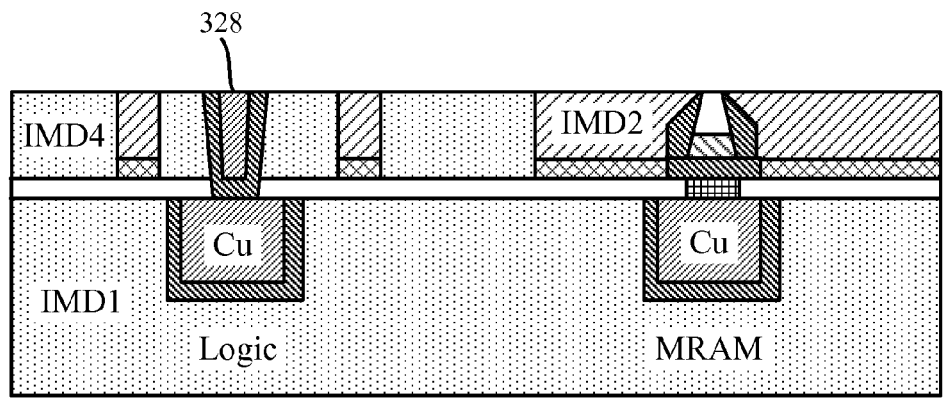

In FIG. 3G, step S300G, logic IMD layer 308l is patterned and via 328 is formed to connect to bottom metal line 316bl on the logic side.

Figure 3H:
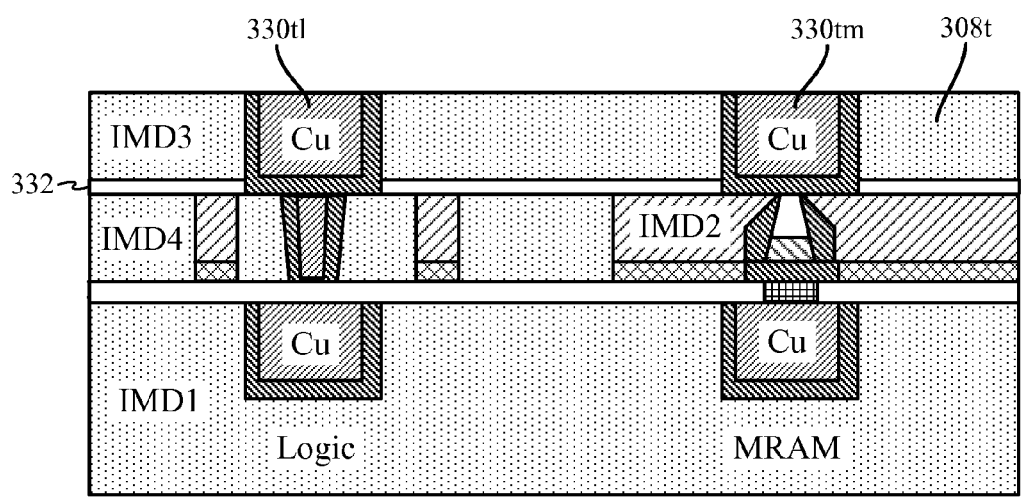

In FIG. 3H, step S300H, cap layer or ESL 332 is deposited on top of logic IMD layer 308l and MRAM IMD layer 308m. Top IMD layer 308t (or IMD3) is formed from a low-K dielectric material on top of cap layer 332. In top IMD layer 308t, top metal line 330tl (or "top metal line contact") on the logic side, and top metal line 330tm on the MRAM side, are formed. Top metal line 230tl contacts with via 328 and top metal line 230tm contacts HM 304. This manner of forming the interconnects is once again a single damascene process. Since these interconnects comprising top metal lines 230tl and 230tm are formed in low-K top IMD layer 208t, parasitic capacitance is low. The parasitic capacitance is further lowered even for via 328 due to the low-K logic IMD layer 308l. In this manner, both low capacitance in the low-K logic IMD layer 308l and top IMD layer 308t as well as high mechanical stability in the high-K MRAM IMD layer 308m are achieved in the second embodiment.

Proceeding now to a third embodiment, the use of at least one air gap to facilitate the requirements of low capacitance and high mechanical stability, where needed, will now be described with reference to FIGS. 4A-G which illustrate cross-sectional views for exemplary process steps S400A-g respectively, along with related components, for formation of an exemplary semiconductor device 400 comprising MRAM and logic elements. It will be noted that FIGS. 4A-E involving steps S400A-E are similar in some aspects to FIGS. 2A-E with steps S200A-E, and thus, a description of these steps with reference to FIGS. 4A-E will be condensed for the sake of brevity. In the third embodiment, a single-damascene process is used for an interconnect or wire level, where a low-K dielectric is used and combined with placement of air-gaps. The air gaps lower capacitance and avoid the need for high-temperature ultraviolet (UV) curing. It will be understood by those skilled in the art that the disclosed aspects are also applicable to interconnect or wire levels formed using a dual-damascene process.

Figure 4A:
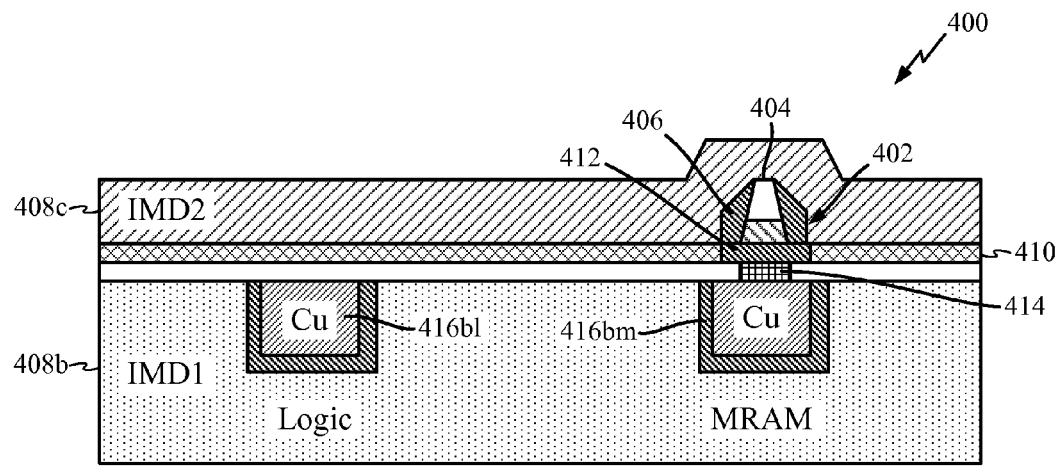
FIGS. 4A-G illustrate cross-sectional views for an exemplary process steps S400A-G respectively, and related components, for formation of a third exemplary semiconductor device 400.

FIG. 4A, illustrates an initial view of semiconductor device 400 formed in step S400A is illustrated, where MTJ 402 including hard mask (HM) 404, and protective side cap 406 are formed in common IMD layer 408c (IMD2), where one or more cap layers 410 separate common IMD layer 408c from bottom IMD layer 408b (IMD1). Bottom IMD layer 408b comprises bottom metal lines 416bl on the logic side and 416bm on the MRAM side. The bottom metal lines 416bl and 416bm are exemplarily made of copper (Cu). MTJ 402 is coupled to bottom electrode (BE) 412, shown to be formed within one of cap layers 410, and coupled to bottom metal line 416bm through BE contact 414 formed within another one of cap layers 410. Following formation of MTJ 402, common IMD layer 208c is then deposited, where common IMD layer 208c is of a high-K and high rigidity, which provides MTJ 402 with a higher mechanical stability.

Figure 4B:
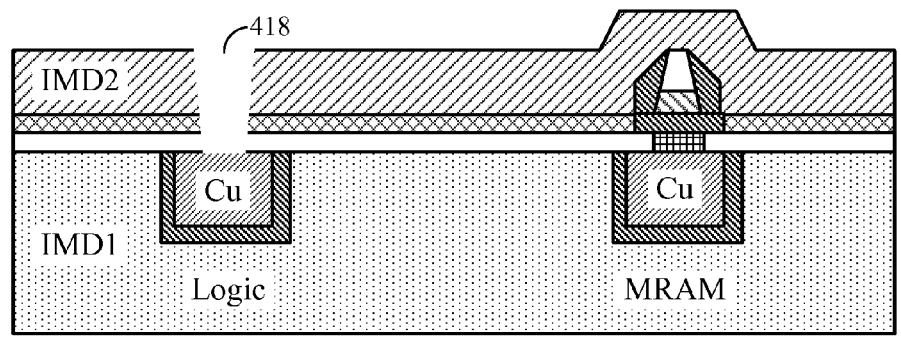
Figure 4C:
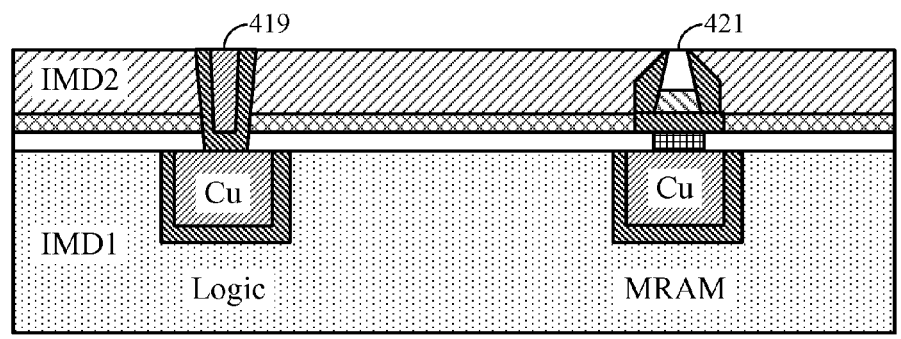

Moving to FIG. 4B, step S400B is illustrated where hole 418 for a via is patterned and etched. In FIG. 4C, step S400C, a barrier metal or copper filling is performed in hole 418 to form via 419. Additionally, in this step, a process of planarization or chemical mechanical polishing (CMP) is used to expose the top surface 421 of MTJ 202, or rather, the top surface 421 of HM 204.

Figure 4D:
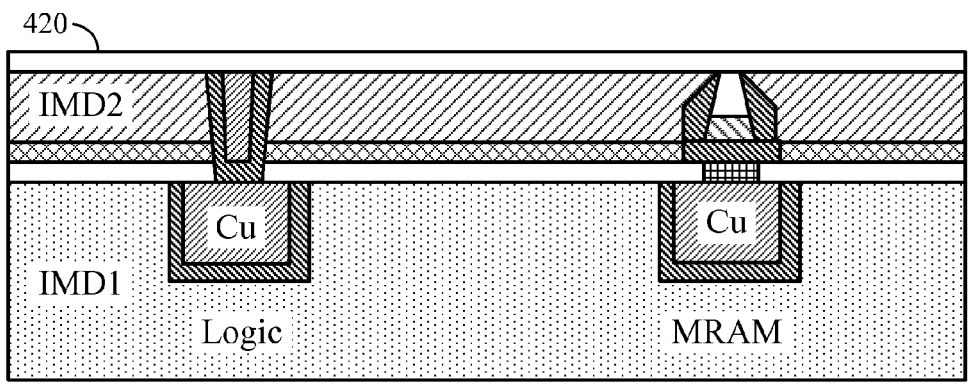

In FIG. 4D, step S400D, a dielectric capping layer 420 is deposited as an etch stop layer (ESL) over common IMD layer 408c.

Figure 4E:
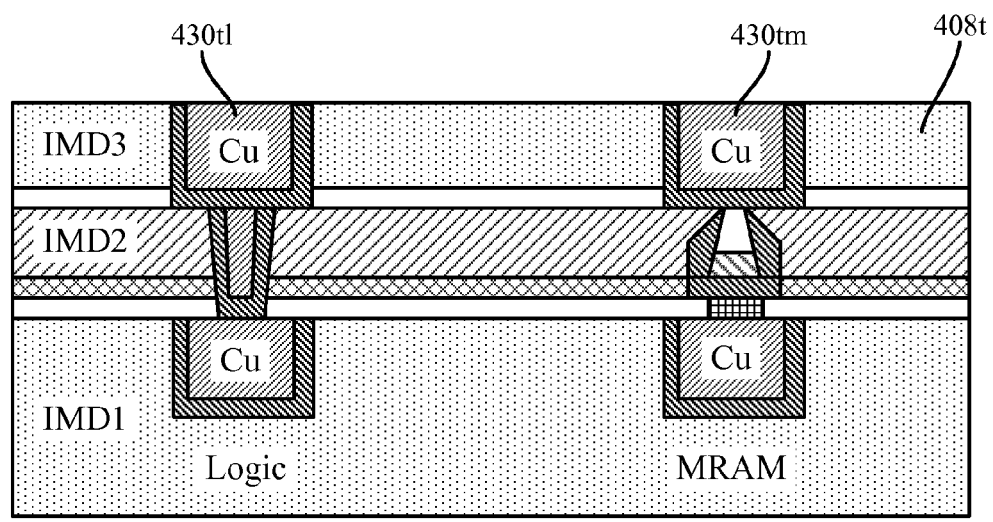

Following this, FIG. 4E, step S400E, includes filling top IMD layer 408t over cap layer 420. Top IMD layer 408t (or IMD3) is formed from a low-K dielectric material. However, deviating from the aspects of FIG. 2E, step S200E, top IMD layer 408t is a dummy IMD layer which is used for forming metal contacts. In the following steps, aspects for forming at least one air gap for this dummy top IMD layer 408t will be described. With continuing reference to FIG. 4E, top metal line 230tl (or "top metal line contact") on the logic side, and top metal line 230tm on the MRAM side, are formed in dummy top IMD layer 408t, once again, in a single damascene process, where top metal line 230tl contacts with via 219 and top metal line 230tm contacts HM 204.

Figure 4F:
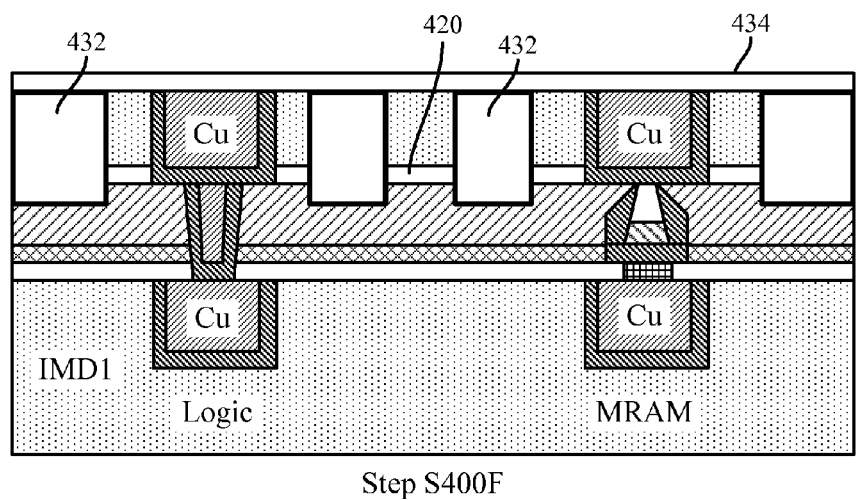

In FIG. 4F, step S400F, one or more air gaps 432 are created in top IMD layer 408t, where, as shown, these air gaps 432 may encroach on common IMD layer 408c as well. Air gaps 432 may be formed using an additional mask and they operate to further lower effective K of the dummy top IMD layer 408t as well as that of common IMD layer 408c, without compromising mechanical stability around MTJ 402 during the MRAM formation. Another cap layer 434 may be formed on top of air gaps 432 and dummy top IMD layer 408t as shown.

Figure 4G:
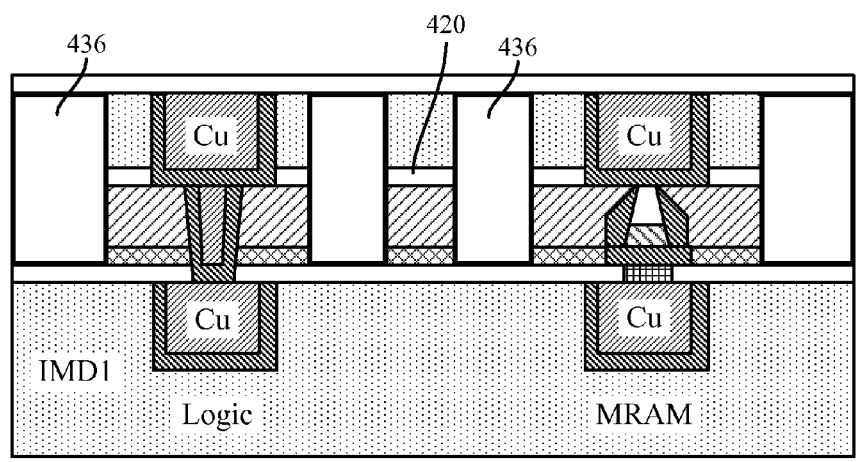

In FIG. 4G, step S400G, an alternative to step S400F of FIG. 4F is illustrated, where the formation of air gaps 436 extends all the way through dummy top IMD layer 408t and common IMD layer 408c. As shown, air gaps 436 may extend to cap layer 420, whose formation was discussed in step S400D of FIG. 4D.

The air gaps 434 and 436 (depending on which implementation is chosen amongst steps S400F and S400G) effectively lower the capacitance of semiconductor device 400, but since the IMD layers including high-K common IMD layer 408c are retained around MTJ 400, mechanical stability is not compromised.

With reference now to FIGS. 5A-L, a fourth embodiment will be described, wherein an MRAM integration is separated from a bottom IMD layer comprising bottom metal contacts by one or more additional IMD layers and cap layers. Aspects of the fourth embodiment allow for additional room for MRAM integration, as well as improving mechanical stability and reducing capacitance at advanced device nodes. In this embodiment, a single damascene via level is used for via formation in a low-K dielectric, where the single damascene process may also be used for forming a bottom electrode of the MTJ.

Figure 5A:
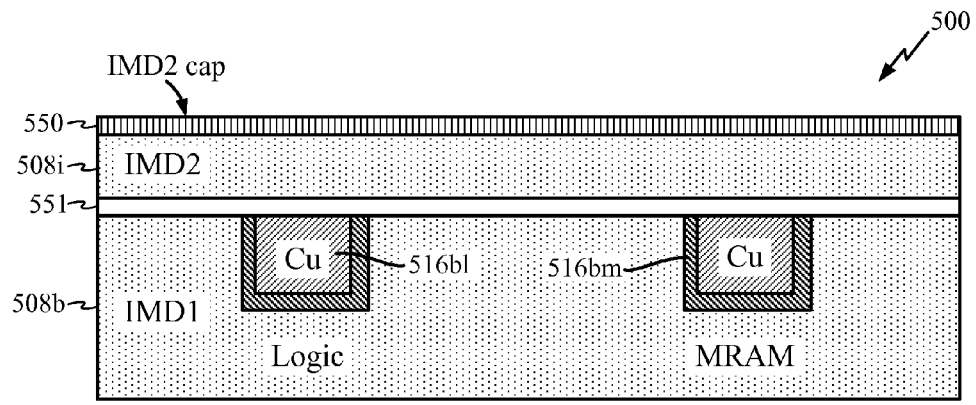
FIGS. 5A-K illustrate cross-sectional views for an exemplary process steps S500A-K respectively, and related components, for formation of a fourth exemplary semiconductor device 500.

As such, in FIG. 5A, step S500A, an initial step for formation of semiconductor device 500 comprising MRAM and logic elements, is illustrated. As shown, bottom IMD layer 508b (IMD1) is formed with bottom metal lines 516bl on the logic side and 516bm on the MRAM side. The bottom metal lines 516bl and 516bm are exemplarily made of copper (Cu). Cap layer 551 may be formed on top of bottom IMD layer 508b and intermediate IMD layer 508i (IMD2) is deposited on top of cap layer 551. Intermediate IMD layer 508i may be low-K, for example, as used in previous embodiments on the logic side, and the thickness of intermediate IMD layer 508i may correspond to that of a via height for example. A thin cap layer 550 (e.g., 5-10 nm, formed from SiO2 or SiC or other suitable dielectric material) is deposited on the low-K intermediate IMD layer 508i.

Figure 5B:
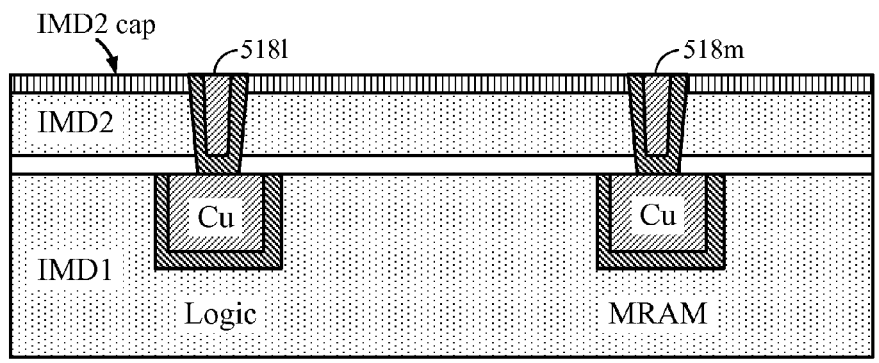

In FIG. 5B, step S500B, first and second vias such as logic via 518 and MRAM via 518m, on the logic side and MRAM side, respectively, are formed, for example, from a single damascene process. CMP is performed which stops on cap layer 550 and exposes logic and MRAM vias 418l and 418m, respectively.

Figure 5C:
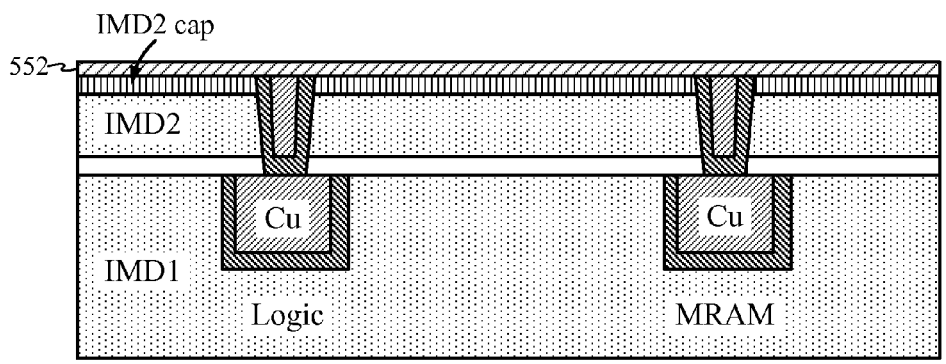

In FIG. 5C, step S500C, a surface preparation layer 552 is added on top of cap layer 550 and logic and MRAM vias 418l and 418m. Surface preparation layer 552 may be formed from TaN, for example, and a light CMP process may be performed on top of surface preparation layer 552 to create an ultra-smooth top surface (e.g., with a surface roughness of less than 5 A).

Figure 5D:
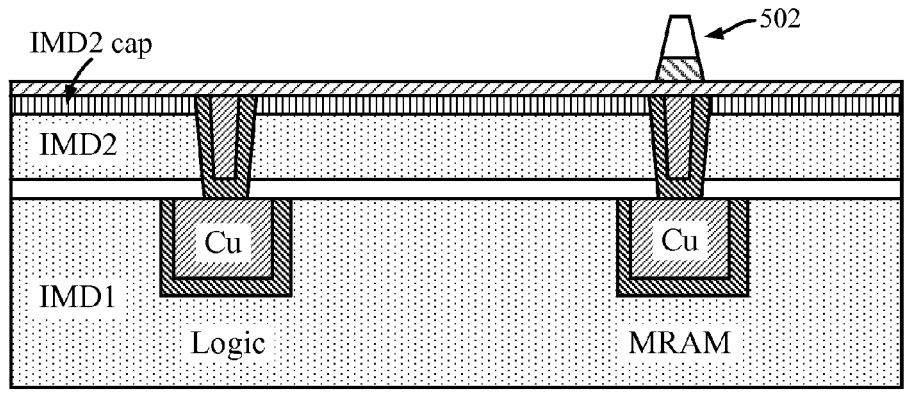
Figure 5E:
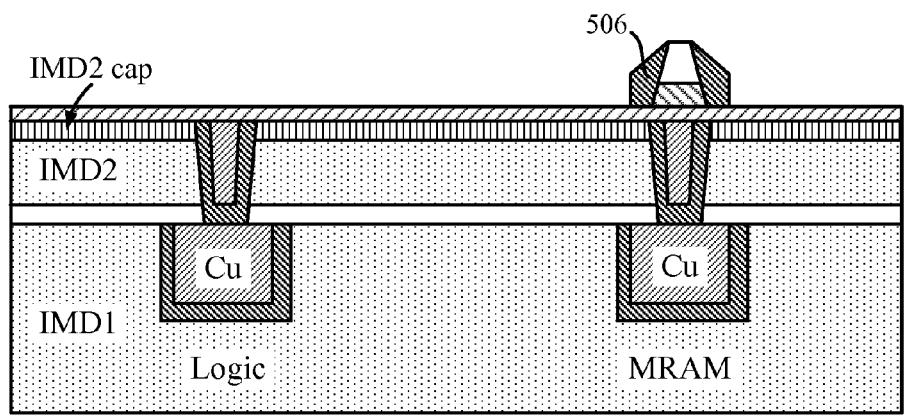
Figure 5F:
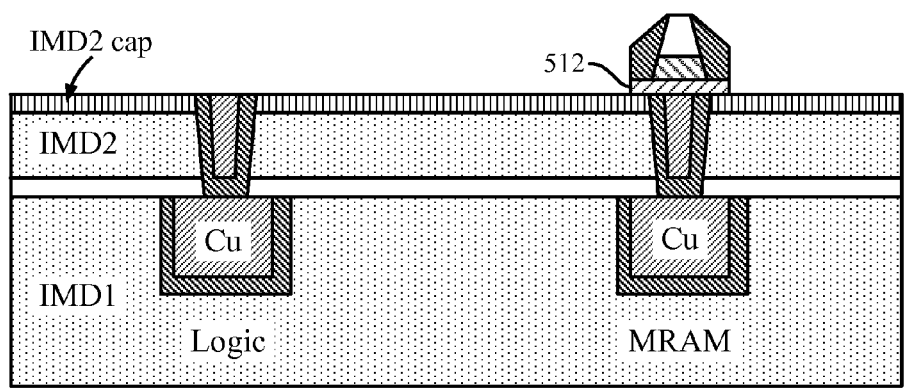
Figure 5G:
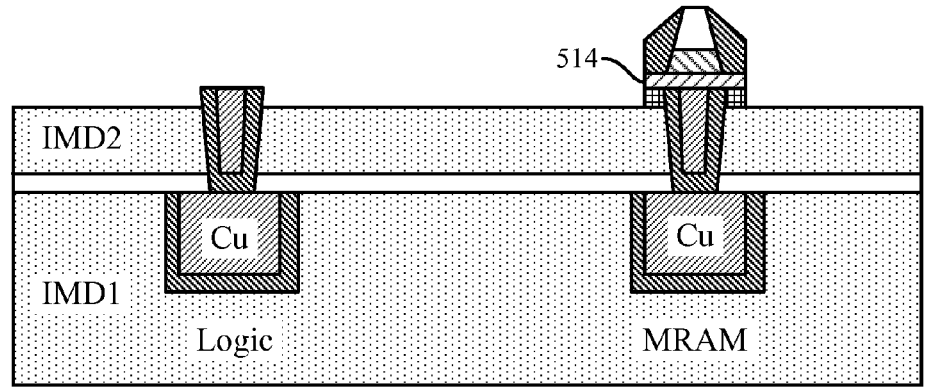

In FIG. 5D, step S500D, deposition of MTJ 502 is made on top of surface preparation layer 552, where patterning MTJ 502 may be stopped within the MTJ stack 502 or within the ultra-smooth top of surface preparation layer 552. In FIG. 5E, step S500E, sidewalls 506 are formed around MTJ 502, which act as dielectric spacers, and may be formed by conformal deposition followed by a directional etch. In FIG. 5F, step S500F, any remaining conductive layers, possibly including the surface preparation layer 552 are etched to retain only segment 512 underneath MTJ 502. In FIG. 5G, cap layer 550 is also etched (e.g., using a short dilute Hydrogen Fluoride (DHF) etch or a gentle dry etch), and segment 514 is retained underneath segment 512.

Figure 5H:
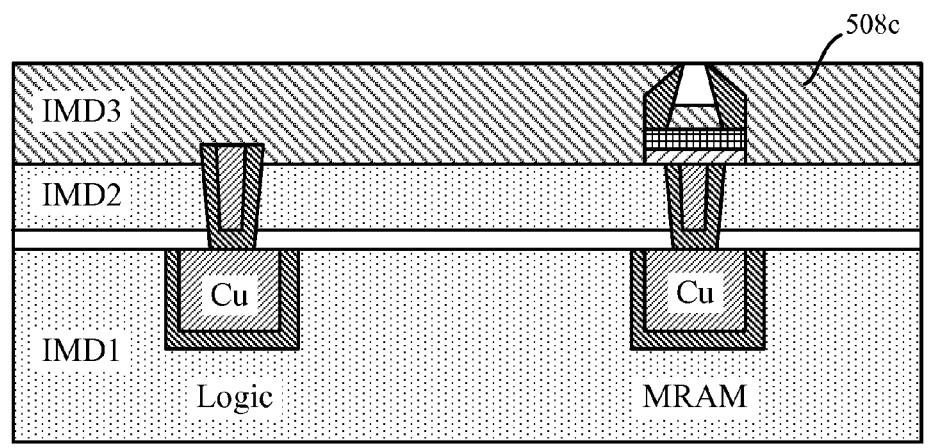

In FIG. 5H, step S500H, common IMD layer 508c (IMD3) of rigidity sufficient to provide required structural support is deposited and planarized back to land on top of MTJ 502.

Figure 5I:
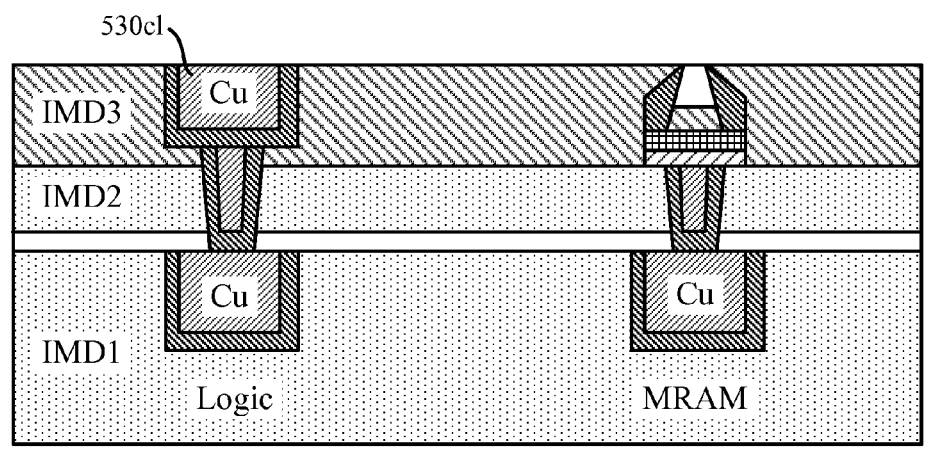

In FIG. 5I, step S500I, common metal line 530tl is formed using a single damascene process in common IMD layer 508c on the logic side.

Figure 5J:
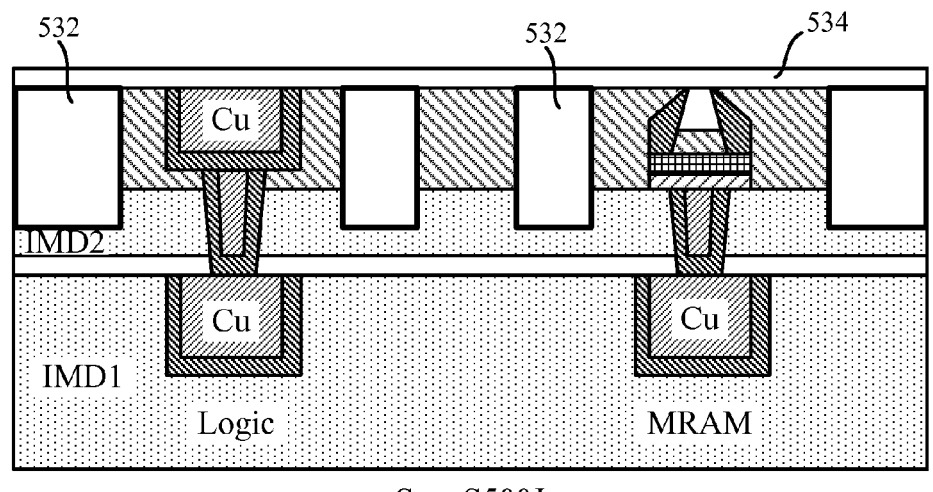

In FIG. 5J, step S500J, air gaps 532 are created, similar to the third embodiment, for example, using an extra mask. Air gaps 532 reduce the effective K or capacitance of semiconductor device 500. Cap layer 534 may be formed on top of air gaps 532 and common IMD layer 508c. Accordingly, it is seen that the combination of intermediate IMD layer 508i and common IMD layer 508c extend between the bottom cap layer 551 and the top cap layer 534.

Figure 5K:
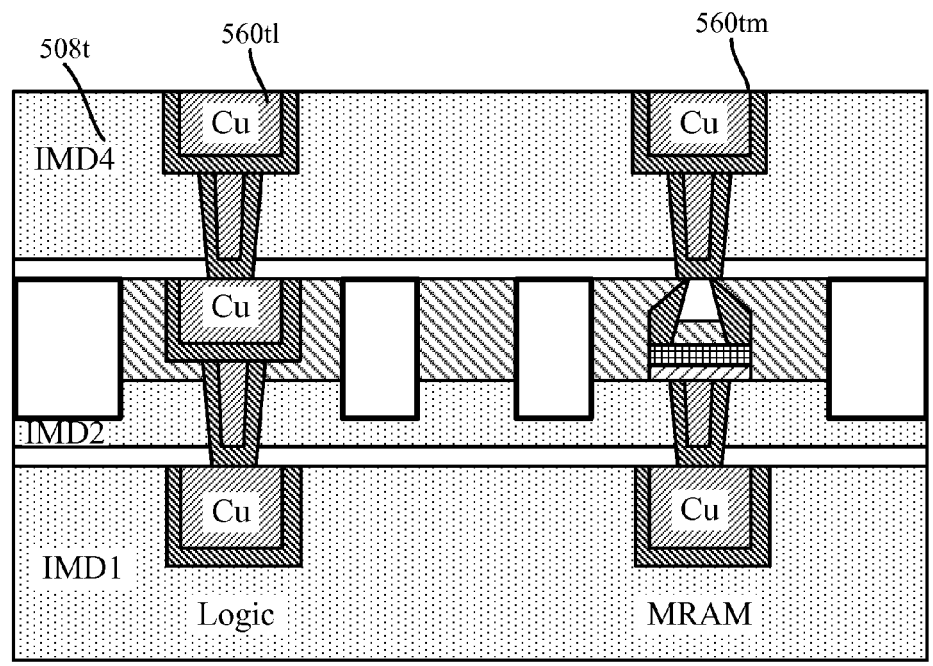

In FIG. 5K, step S500K, the process proceeds to formation of next higher level interconnects. For example, top IMD layer 508t (IMD4) may be formed on top of cap layer 534 and top metal layers 560tl and 560tm, on the logic side and MRAM side, respectively, may be formed, along with corresponding vias in top IMD layer 508t, using, for example, a dual damascene process. In this manner, in the fourth embodiment, the common layer including MTJ 502, and common metal line 530cl can include air gaps 532, and thus have low capacitance as well as high mechanical stability.

This manner of forming the interconnections is a single damascene process. Since these interconnects comprising top metal lines 230tl and 230tm are formed in low-K top IMD layer 208t, parasitic capacitance is low. In this manner, both low capacitance in the low-K top IMD layer 208t and high mechanical stability in the high-K common IMD layer 208c are achieved in the first embodiment, which avoids the aforementioned drawbacks of conventional MRAM integration.

Figure 6:
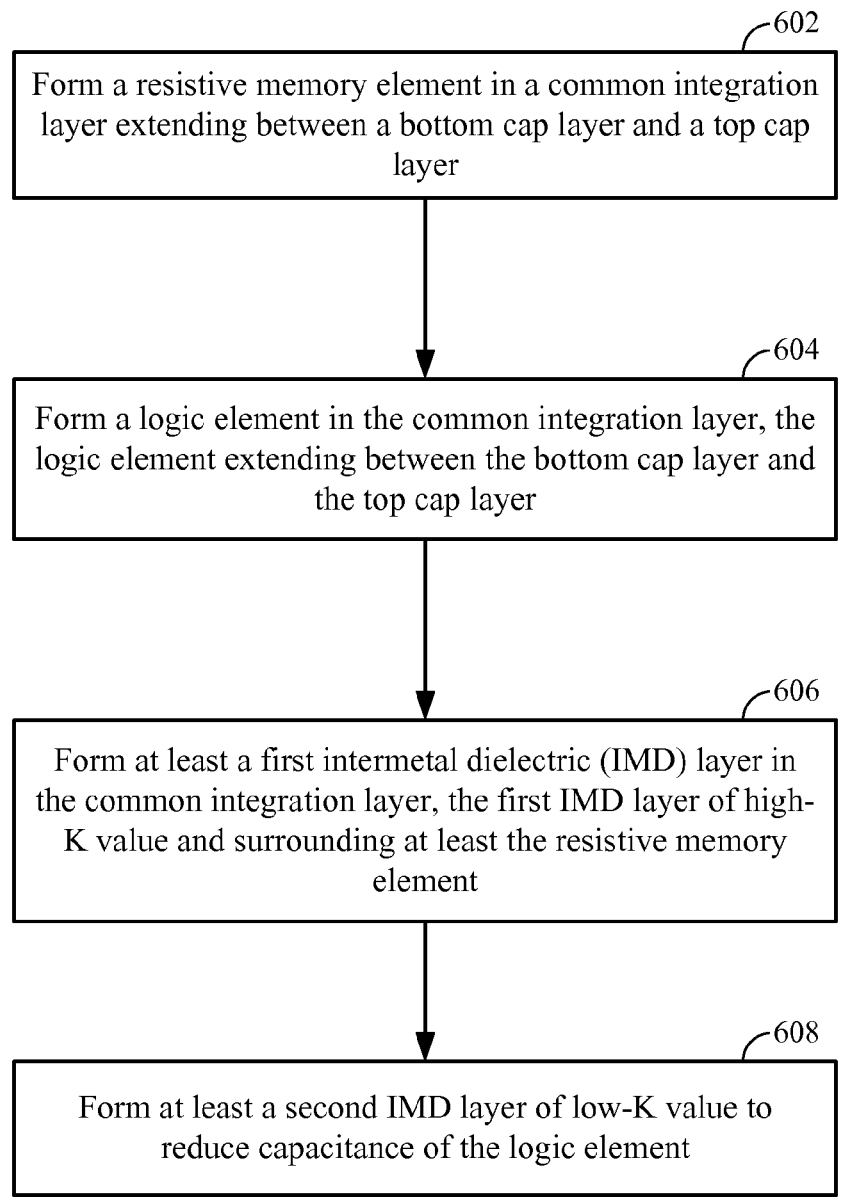
FIG. 6 illustrates a flowchart of an exemplary process of forming a semiconductor device according to aspects of this disclosure.

It will be appreciated that embodiments include various methods for performing the processes, functions and/or algorithms disclosed herein. For example, as illustrated in FIG. 6, an embodiment can include a method of forming a semiconductor device (e.g., 200, 300, 400), the method comprising: forming a resistive memory element (e.g., 202, 302, 402) in a common integration layer (e.g., 208c, 308c, 408c) extending between a bottom cap layer (e.g., 210, 310, 410) and a top cap layer (e.g., 220, 322, 420)—Block 602; forming a logic element (e.g., 219, 324, 419) in the common integration layer, the logic element extending between the bottom cap layer and the top cap layer—Block 604; forming at least a first intermetal dielectric (IMD) layer (e.g., IMD2) in the common integration layer, the first IMD layer of high-K value and surrounding at least the resistive memory element—Block 606; and forming at least a second IMD layer (e.g., IMD3, IMD4) of low-K value to reduce capacitance of the logic element—Block 608.

Figure 7:
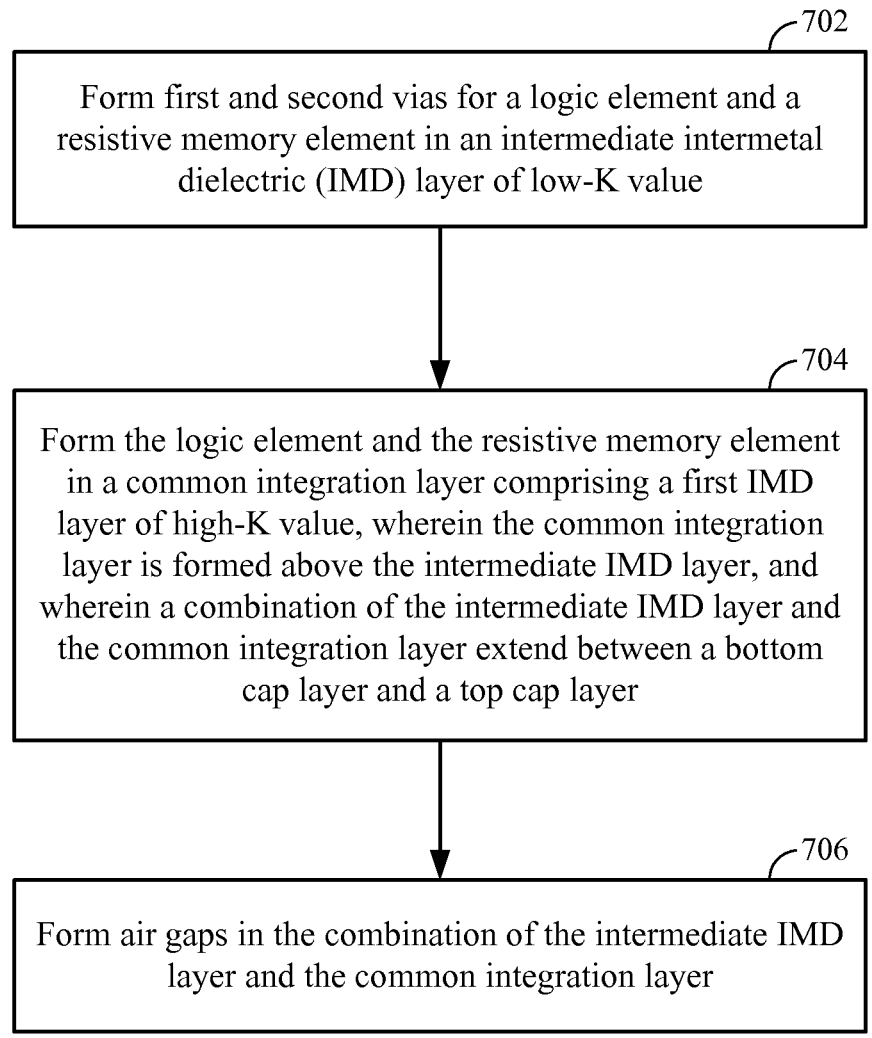
FIG. 7 illustrates a flowchart of another exemplary process of forming a semiconductor device according to aspects of this disclosure.

Similarly, in another example, as illustrated in FIG. 7, an embodiment can include a method of forming a semiconductor device (e.g., 500), the method comprising: forming first and second vias (e.g., 518l and 518m) for a logic element (e.g., 530cl) and a resistive memory element (e.g., 502) in an intermediate intermetal dielectric (IMD) layer (e.g., 508i) of low-K value—Block 702; forming the logic element and the resistive memory element in a common integration layer (e.g., 508c) comprising a first IMD layer of high-K value, wherein the common integration layer is formed above the intermediate IMD layer, and wherein a combination of the intermediate IMD layer and the common integration layer extend between a bottom cap layer (e.g., 551) and a top cap layer (e.g., 534)—Block 704; and forming air gaps (e.g., 532) in the combination of the intermediate IMD layer and the common integration layer—Block 706.

Figure 8:
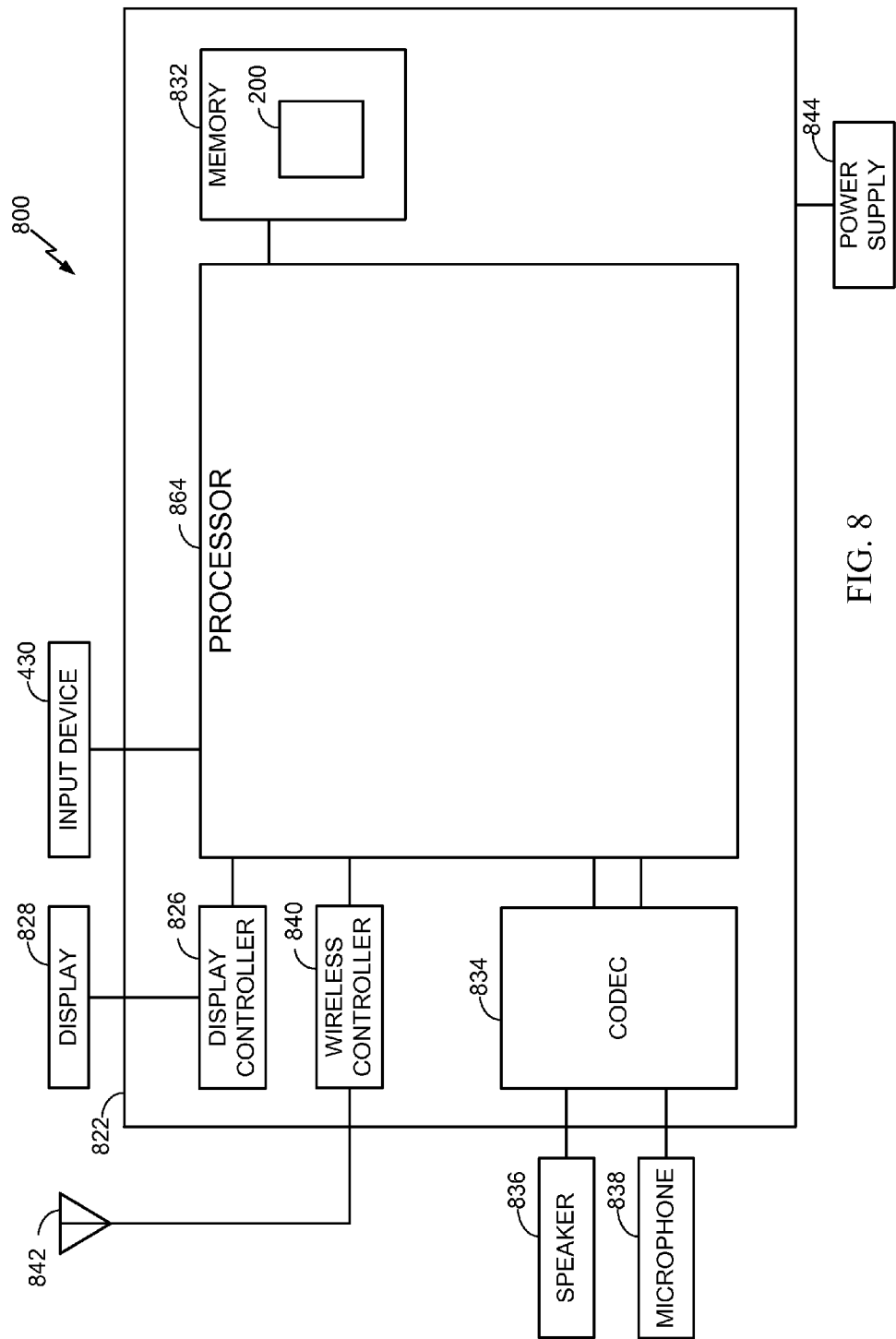
FIG. 8 illustrates a high-level diagram of a wireless device in which exemplary aspects may be advantageously employed.

Referring to FIG. 8, a block diagram of a particular illustrative aspect of wireless device 800 configured according to exemplary aspects is depicted. Wireless device 800 includes processor 864 coupled to memory 832. Although FIG. 8 shows memory 832 comprising semiconductor device 200 as one example, it will be understood that memory 832 and/or memory elements in processor 864 may include one or more semiconductor devices such as semiconductor devices 200, 300, 400, or 500 configured according to exemplary aspects. FIG. 8 also shows display controller 826 that is coupled to processor 864 and to display 828. Coder/decoder (CODEC) 834 (e.g., an audio and/or voice CODEC) can be coupled to processor 864. Other components, such as wireless controller 840 (which may include a modem) are also illustrated. Speaker 836 and microphone 838 can be coupled to CODEC 834. FIG. 8 also indicates that wireless controller 840 can be coupled to wireless antenna 842. In a particular aspect, processor 864, display controller 826, memory 832, CODEC 834, and wireless controller 840 are included in a system-in-package or system-on-chip device 822.

In a particular aspect, input device 830 and power supply 844 are coupled to the system-on-chip device 822. Moreover, in a particular aspect, as illustrated in FIG. 8, display 828, input device 830, speaker 836, microphone 838, wireless antenna 842, and power supply 844 are external to the system-on-chip device 822. However, each of display 828, input device 830, speaker 836, microphone 838, wireless antenna 842, and power supply 844 can be coupled to a component of the system-on-chip device 822, such as an interface or a controller.

It should be noted that although FIG. 8 depicts a wireless communications device, processor 864 and memory 832 may also be integrated into a set-top box, a music player, a video player, an entertainment unit, a navigation device, a personal digital assistant (PDA), a fixed location data unit, a mobile phone, a smart phone, or a computer and/or an semiconductor die.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for resistive memory device integration with logic elements, having reduced capacitance and high mechanical stability. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of forming a semiconductor device, the method comprising:
   forming first and second vias for a logic element and a resistive memory element, respectively, in an intermediate intermetal dielectric (IMD) layer of low-K value;
   forming the logic element and the resistive memory element in a first IMD layer of high-K value, wherein the first IMD layer is formed above the intermediate IMD layer, and wherein a combination of the intermediate IMD layer and the first IMD layer extends between a bottom cap layer and a top cap layer; and
   forming at least one air gap in the combination of the intermediate IMD layer and the first IMD layer, with at least a portion of the at least one air gap in each of the intermediate IMD layer and the first IMD layer.

2. The method of claim 1, comprising forming the logic element as a metal line using a single damascene process.

3. The method of claim 1, comprising forming the first and second vias from a single damascene process.

4. The method of claim 1, further comprising forming a top IMD layer of low-K value on top of the top cap layer, and forming top metal line contacts to the logic element and the resistive memory element in the top IMD layer.

5. The method of claim 4, comprising forming the top metal line contacts from a dual damascene process.

6. The method of claim 1, further comprising forming bottom metal line contacts in a bottom IMD layer below the bottom cap layer.

7. A semiconductor device comprising:
   first and second vias for a logic element and a resistive memory element formed in an intermediate intermetal dielectric (IMD) layer of low-K value,
   wherein the logic element and the resistive memory element are formed in a first IMD layer of high-K value, wherein the first IMD layer is formed above the intermediate IMD layer, and wherein a combination of the intermediate IMD layer and the first IMD layer extend between a bottom cap layer and a top cap layer; and at least one air gap formed in the combination of the intermediate IMD layer and the first IMD layer, with at least a portion of the at least one air gap in each of the intermediate IMD layer and the first IMD layer.

8. The semiconductor device of claim 7, wherein the logic element comprises a metal line formed from a single damascene process.

9. The semiconductor device of claim 7, further comprising a top IMD layer of low-K value on top of the top cap layer, and top metal line contacts to the logic element and the resistive memory element in the top IMD layer.

10. The semiconductor device of claim 7, further comprising bottom metal line contacts in a bottom IMD layer below the bottom cap layer.

11. The semiconductor device of claim 7 integrated in a device, selected from the group consisting of a set top box, music player, video player, entertainment unit, navigation device, communications device, personal digital assistant (PDA), fixed location data unit, and a computer.

12. The semiconductor device of claim 7, integrated in at least one semiconductor die.

* * * * *